United States Patent [19]
Gibbons

[11] Patent Number: 6,123,203
[45] Date of Patent: Sep. 26, 2000

[54] SYSTEM AND METHOD FOR MOUNTING A COMPUTER SYSTEM COMPONENT WITHIN A HOUSING

[75] Inventor: Clifford A. Gibbons, Round Rock, Tex.

[73] Assignee: Dell USA L.P., Round Rock, Tex.

[21] Appl. No.: 09/352,796

[22] Filed: Jul. 13, 1999

[51] Int. Cl.[7] ...................................................... A47F 7/00
[52] U.S. Cl. .............................................................. 211/26
[58] Field of Search ............................ 211/26, 189, 190, 211/151; 312/265; 361/829

[56] References Cited

U.S. PATENT DOCUMENTS

| | | | |
|---|---|---|---|
| 5,165,770 | 11/1992 | Hahn | 211/26 |
| 5,571,256 | 11/1996 | Good et al. | 211/26 |
| 5,683,001 | 11/1997 | Masuda et al. | 211/26 |
| 5,791,498 | 8/1998 | Mills | 211/26 |
| 5,819,956 | 10/1998 | Rinderer | 211/26 |
| 5,850,925 | 12/1998 | Gandre | 211/26 |
| 5,890,602 | 4/1999 | Schmidt | 211/26 |
| 5,934,485 | 8/1999 | Harris et al. | 211/26 |
| 5,979,672 | 11/1999 | Gemra et al. | 211/26 |
| 5,992,808 | 11/1999 | Morrow | 211/26 |
| 6,006,925 | 12/1999 | Sevier | 211/26 |
| 6,021,909 | 2/2000 | Tang et al. | 211/26 |

Primary Examiner—Alvin Chin-Shue
Assistant Examiner—Sarah Purol
Attorney, Agent, or Firm—Baker Botts L.L.P.

[57] ABSTRACT

A system and method for mounting a desk side computer system component within a housing. The mounting system includes a component chassis that defines an interior space, a mating slot formed in the component chassis that provides access to the interior space, an adaptive mounting ear and an insertion tab associated with the adaptive mounting ear. The adaptive mounting ear may be operable to simultaneously couple with both the housing and the component chassis. When coupling the adaptive mounting ear to the component chassis, the insertion tab is inserted through the mating slot associated with the component chassis and into the interior space defined by the component chassis. The insertion tab remains within the interior space when the adaptive mounting ear is coupled to the component chassis.

20 Claims, 2 Drawing Sheets

SYSTEM AND METHOD FOR MOUNTING A COMPUTER SYSTEM COMPONENT WITHIN A HOUSING

TECHNICAL FIELD

This disclosure relates in general to the field of electronic equipment enclosures and, more particularly, to a system and method for mounting a computer system component within a housing.

BACKGROUND

Computer systems are becoming increasingly complex. It is not unusual for a single computer system to include a combination of several computer components. Though the components may include diverse types of equipment (e.g., telephonic equipment or computing equipment), system users usually prefer that the system be housed in a common enclosure. This preference influenced the development of rack storage devices (racks). Racks are standard in the computer industry and allow components to be placed within them in a modular fashion such that various combinations of components can be integrated into a single system.

A number of vendors sell standard EIA (Electronics Industries Association) racks, which comply with EIA specifications. These specifications include size limitations. Many of these racks employ a fairly simple slide device for securing the system components within the rack. The slide device extends from the rack to facilitate the accessing of the component and retracts into the rack to allow for the in-place securing of the component. The slide device is not, however, essential.

Whether a rack employs the slide device or some other component mounting device, each component is often releasably secured to the rack. As such, the component and the mounting hardware necessary to secure the component in place must fit within the rack. With components designed for rack storage, this is rarely a problem. With desk side and desk top components, however, EIA rack width limitations can be troublesome.

Conventional rack mounting hardware includes a component face plate which is wider than the component itself. As such, a portion of the face plate, sometimes referred to as an "ear", extends beyond the width of the component. The ear provides a surface for securely attaching the component to a rack. This mounting option, however, is often unsatisfactory for components designed for desk side and desk top storage. These devices usually have an existing face plate that is similar in width to the component. As such, there is no ear for attaching the component to the rack. Moreover, these devices are often too wide to allow for horizontal mounting with a bolt-on ear flange. As a result, ears cannot be added to the side of many computer components, because such an addition would make the component too wide to fit horizontally within a typical EIA rack.

When a user desires to mount a component that is too wide in a rack, the user usually resorts to vertical mounting. There are several disadvantages associated with this conventional solution. For example, vertical mounting requires the use of unusual and more costly mounting hardware. In addition, vertical mounting techniques may waste valuable rack storage space by leaving unused horizontal space between adjacent components. Moreover, the user is, generally, unable to fill this unused space with other components mounted in a side by side vertical manner. Most conventional slide mechanisms are not designed to support, in an extended position, the additional weight produced with side by side mounting.

SUMMARY

In accordance with teachings of the present disclosure, a system and method are described for mounting a computer system component within a housing. The disclosed system and method provide significant advantages over prior technologies.

According to one aspect of the present disclosure, a component chassis either completely or partially defines an interior storage space. The component chassis preferably has a mating slot that can open into the defined interior storage space. Alternatively, the mating slot may open into a second interior space spaced from the defined interior storage space.

One embodiment of a mating may have dimensions, which allow receiving a tab associated with an adaptive mounting ear. The adaptive mounting ear may be operable to simultaneously couple both the component chassis and a rack or some other housing device. When coupling the adaptive mounting ear to the component chassis, the tab may be inserted through the mating slot and into a selected space defined by the chassis component. Once within the chassis formed space, the tab may assist in coupling the adaptive mounting ear to the component chassis. For example, the tab could include a fastening mechanism for releasably coupling the mounting ear to the component chassis.

In one embodiment, the fastening mechanism may include a flat head screw threaded through a hole formed in a segment of the component chassis (e.g., a wall). Once through the hole, the screw may be threaded into a portion of a tab formed to receive the threaded screw. The hole formed through the chassis may be a countersunk hole. A countersunk hole will preferably allow the head of the screw to become flush with an outer surface of the component chassis when the screw is secured in place. With at least one adaptive mounting ear secured to its chassis, a desk side computer system component or some other component of electronic equipment may be mounted within a housing (e.g., a rack).

Technical advantages include allowing the addition of an ear flange to a component chassis without adding width to the chassis. Many components, including those designed for desk side or desk top mounting, have an existing face plate that is similar in width to the component body. As such, it may be difficult to attach the component to the rack. Moreover, many of these components become too wide with the addition of a bolt-on ear flange for horizontal mounting in a typical EIA rack.

Another technical advantage includes space saving potential within a rack or similar housing. Conventionally, mounting a desk side or desk top device in a rack often requires the use of vertical mounting equipment and techniques. Vertical mounting frequently wastes valuable rack storage space by leaving unused horizontal space. Space may be saved when devices that had been mounted vertically are mounted horizontally using an apparatus incorporating teachings of the present disclosure. Additionally, the cost of time and materials for mounting computer components within a rack or housing may be reduced. In fact, an adaptive mounting ear incorporating the teachings of the present disclosure may be formed from a single piece of metal or some other relatively sturdy material. A mounting system including a mating slot and an adaptive mounting ear may be designed to minimize electromagnetic field problems and undesired air flow problems.

Other technical advantages will be apparent to one of skill in the art from the following description, drawings and claims.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
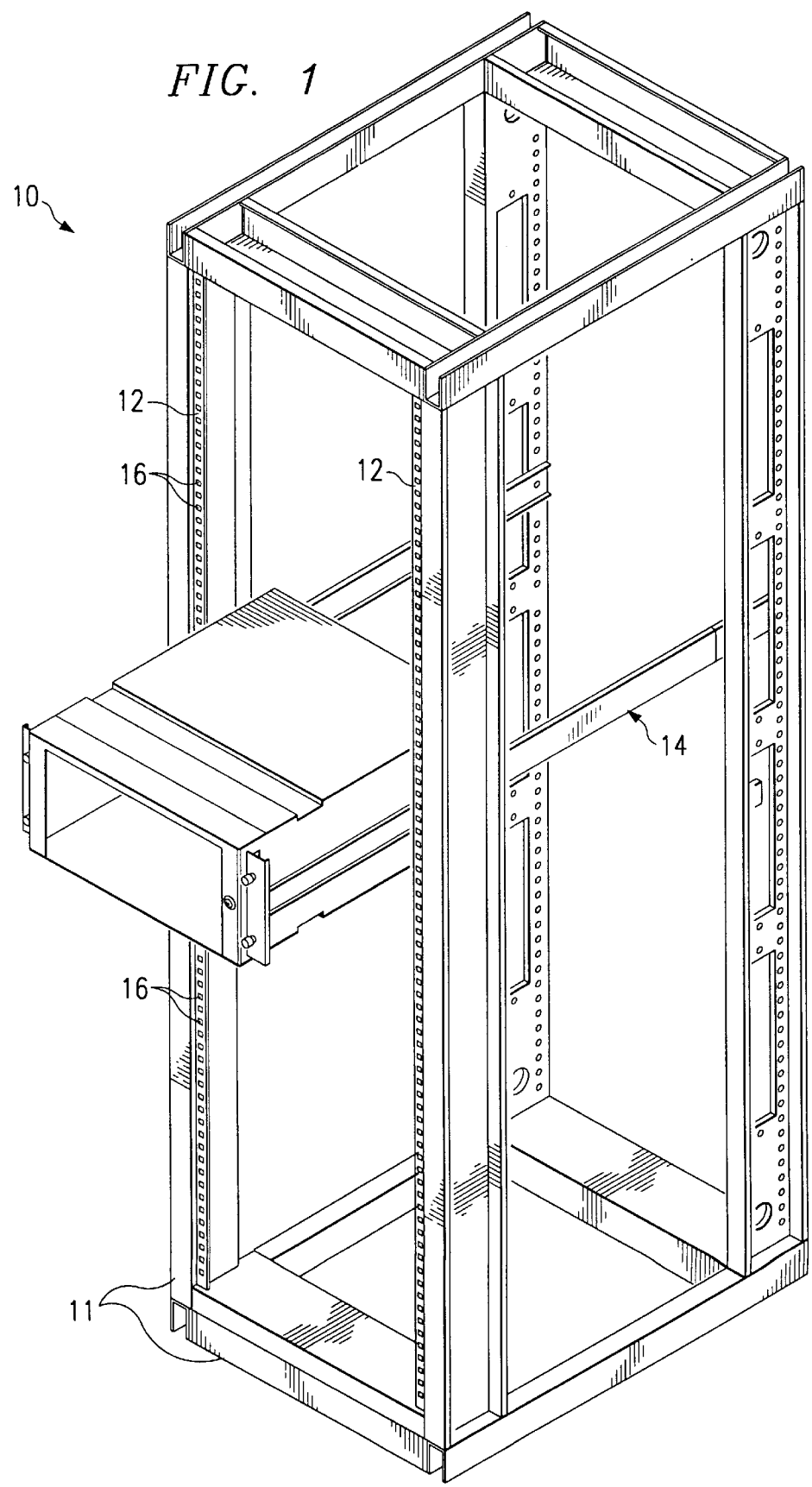
FIG. 1 depicts a typical rack with an attached EIA rail to which a computer component may be releasably secured using one embodiment of an apparatus incorporating teachings of the present disclosure.
Figure 2:
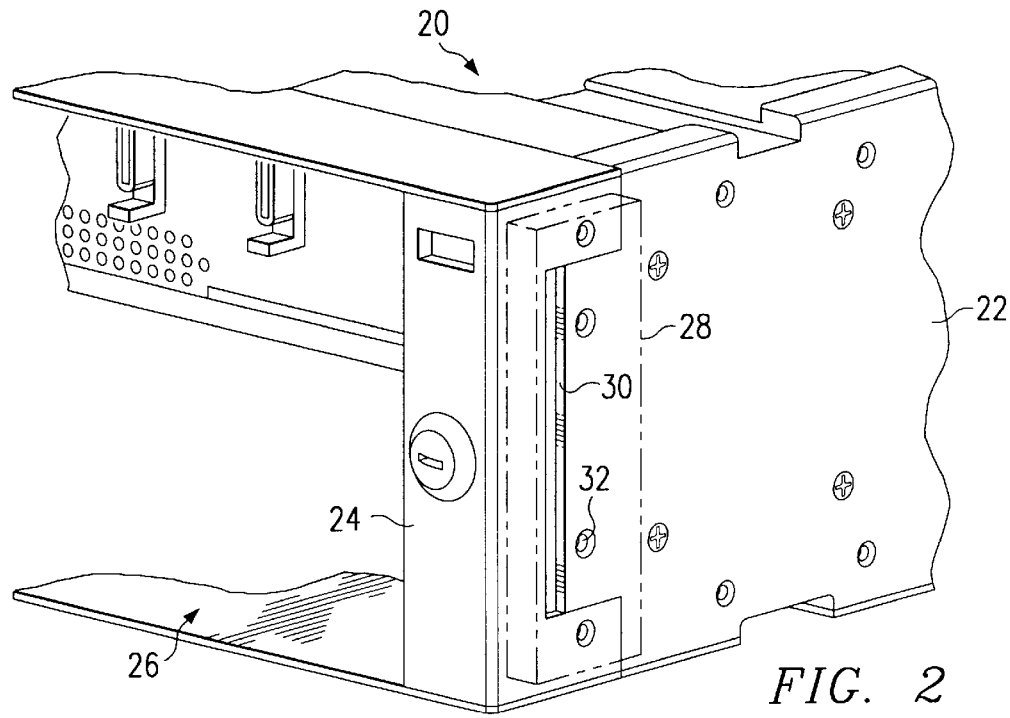
FIG. 2 shows an isometric view with portions broken away of one embodiment of a component chassis for electronic equipment that may be releasably secured with an EIA rail.
Figure 3:
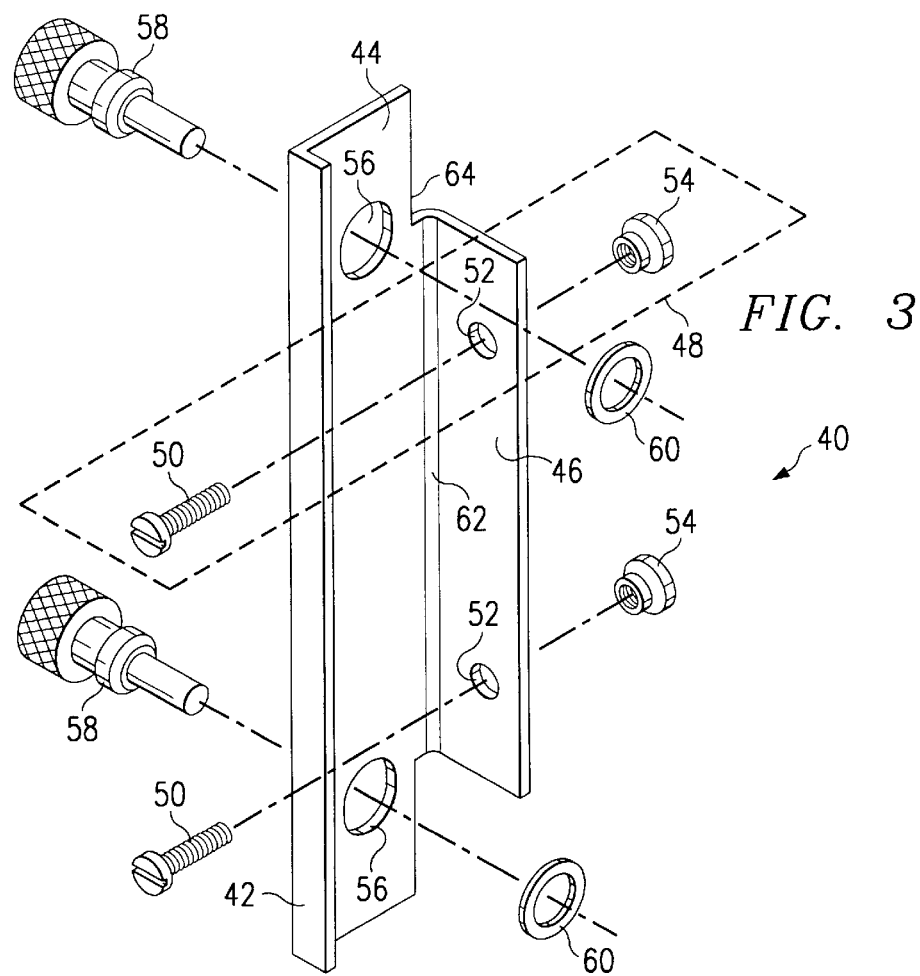
FIG. 3 shows an exploded isometric view of one embodiment of an adaptive mounting ear that may be used with a computer system.

Preferred embodiments and their advantages are best understood by reference to FIGS. 1 through 3, wherein like numbers are used to indicate like and corresponding parts.

FIG. 1 depicts a typical rack, identified generally at 10, for use in releasably mounting components of a computer system adjacent to each other. Rack 10 may also sometimes be referred to as a cabinet or a housing. Rack 10 is defined in part by frame assembly 11. For the embodiment shown in FIG. 1, frame assembly 11 has a generally open configuration which allows relatively easy installation and removal of components therefrom. Also, the generally open configuration of frame assembly 11 allows effective cooling of various computer components releasably received within rack 10.

Various embodiments may be used with a wide variety of open and/or closed cabinets and housings. The embodiments are not limited to use with rack 10.

EIA rails 12 are preferably attached to opposite sides of rack 11 and provide a point at which an adaptive mounting ear may be releasably secured. For the embodiment shown in FIG. 1, EIA rails 12 run approximately the vertical height of rack 10. A number of holes, depicted generally at 16, extend through each EIA rail 12. Rack 10 preferably includes slide mechanism 14. Slide mechanism 14 may be employed to support various computer components. Rack 10 as well as EIA rails 12 are designed and dimensioned in accordance with applicable EIA standard EIA-310-D, the Electronic Industries Association's standard for Cabinets, Racks, Panels, and Associated Equipment.

FIG. 2 shows an isometric view with portions broken away of one embodiment of a component chassis 20 for electronic equipment that may be releasably secured to an EIA rail. The electronic equipment may include, for example, computing equipment or telephony equipment. Component chassis 20 includes a number of walls (e.g., side wall 22) and may include a face plate 24. Face plate 24 of component chassis 20 does not extend significantly beyond the width of component chassis 20 and, as such, does not provide component chassis 20 with a sufficient mounting ear for securing component 20 within a rack (e.g., rack 10 of FIG. 1).

Component chassis 20 at least partially defines an interior space 26 and may also partially define a second interior space 28 that is generally spaced from interior space 26. Interior space 26 (or 28 if it is included) may be accessed through mating slot 30, which can be dimensioned to accept an adaptive mounting ear tab (e.g., tab 46 of FIG. 3). Spacing second interior space 28 from interior storage space 26 may reduce problems associated with EMF (electromagnetic field) leakage and undesired air leakage, which could otherwise arise as a result of leaving interior storage space 26 exposed via mating slot 30. Mating slot 30 may also be dimensioned and located such that interior storage space 26 remains closed (i.e., not exposed) when component chassis 20 couples with an adaptive mounting ear.

Along mating slot 30, countersunk holes 32 may be formed through side wall 22. Countersunk holes 32 facilitate the securing of an adaptive mounting ear (e.g., adaptive mounting ear 40 of FIG. 3) to component chassis 20.

FIG. 3 depicts an exploded view of one embodiment of an adaptive mounting ear, indicated generally at 40. Adaptive mounting ear 40 includes a handling lip 42, a facing surface 44 and a tab 46. Tab 46 may have dimensions that allow it to be inserted through a component chassis mating slot (e.g., mounting slot 30 of FIG. 2) and into an interior space (e.g., interior space 26 or 28 of FIG. 2) defined by the component chassis (e.g., component chassis 20 of FIG. 2). Once inside the interior space, tab 46 may allow for securing adaptive mounting ear 40 to the component chassis with a fastening mechanism 48 associated with tab 46.

As depicted in FIG. 3, fastening mechanism 48 could include, for example, a flat head screw 50 which could thread through a component chassis hole (e.g., counter sunk hole 32 of FIG. 2), through an ear mounting hole 52 formed through tab 46 and into a nut 54. Alternatively, tab 46 could be formed to receive flat head screw 50 at or near ear mounting hole 52. When fastening mechanism 48 is employed, a component chassis wall (e.g., side wall 22 of FIG. 2) can be secured between the head of flat head screw 50 and tab 46.

Regarding other portions of adaptive mounting ear 40, facing surface 44 may be define a facing plane and may intersect tab 46 along joint 62 to form an approximately 90° angle between facing surface 44 and tab 46. As depicted in FIG. 3, facing surface 44 extends beyond the vertical limits of tab 46. In such an embodiment, an offset notch 64 may be used to facilitate attaching adaptive mounting ear to a component chassis such that facing surface 44 rest in substantially the same plane as the component chassis, face plate. Facing surface 44 may include a securing hole 56 prepared there through. Securing hole 56 allows a locking mechanism 58 to partially pass through facing flange 44 and to releasably couple with a receiving device (e.g., EIA rail 12 of FIG. 1), representatively depicted at 60 in FIG. 3, which may be associated with a housing. Facing surface 44 may be held in place between a shoulder of locking mechanism 58 and receiving device 60. When locking mechanism 58 secures adaptive mounting ear 40 in place, a component chassis fastened to tab 46 may also be secured in place.

When locking mechanism 58 is unsecured, handling lip 42 facilitates removal of a component chassis to which adaptive mounting ear 40 may be attached. Handling lip 42 acts as a handle for pulling a component chassis from a housing.

Although the disclosed embodiments have been described in detail, it should be understood that various changes, substitutions and alterations can be made to the embodiments without departing from their spirit and scope.

What is claimed is:

1. A computer system having a rack and a component releasably secured within the rack, comprising:
   a component chassis at least partially defining an interior storage space;
   the component chassis having an outside surface and a mating slot;
   an adaptive mounting ear and a tab associated with the adaptive mounting ear; and
   the tab having a fastening mechanism operable to couple the adaptive mounting ear to the component chassis at the mating slot such that the tab rests within the interior storage space.

2. The system of claim 1, further comprising a second interior space at least partially defined by the component chassis, the second interior space accessible via the mating slot and partitioned from the interior storage space.

3. The system of claim 1 wherein the adaptive mounting ear comprises a facing surface fixed substantially perpendicular to the tab.

4. The system of claim 3 wherein the facing surface comprises a securing hole for coupling the adaptive mounting ear to a portion of the rack.

5. The system of claim 3 wherein the facing surface comprises a securing hole for coupling the adaptive mounting ear to an EIA rail attached to the rack.

6. The system of claim 1 wherein the adaptive mounting ear comprises the tab, a facing surface and a handling lip formed from a single piece of material.

7. The system of claim 1 further comprising:
   a mounting hole extending through the tab; and
   the mounting hole formed to receive a screw.

8. The system of claim 7 further comprising
   a screw having a head;
   at least one counter sunk hole formed through a portion of the component chassis; and
   the hole operable to receive the screw such that the head rests substantially flush with the outside surface of the component chassis.

9. The system of claim 1 wherein the component chassis comprises a desk side computer chassis.

10. A method for securing a chassis of a computer system component within an opening in a housing, comprising:
    coupling an adaptive mounting ear having a tab to the component chassis such that the tab remains within an interior storage space at least partially defined by the component chassis;
    placing the component chassis at a selected location within the opening of the housing; and
    releasably securing the component chassis at the selected location by coupling a portion of the mounting ear to the housing.

11. The method of claim 10, further comprising positioning the adaptive mounting ear to block electromagnetic field radiation and undesired air leaks associated with the component chassis.

12. The method of claim 10 wherein the step of coupling the adaptive mounting ear to the component chassis further comprises:
    inserting the tab through a mating slot formed in the component chassis and into the interior storage space; and
    fastening the adaptive mounting ear to the component chassis.

13. The method of claim 10 wherein the step of coupling the adaptive mounting ear to the component chassis further comprises inserting the tab through a mating slot formed in the component chassis and into a second interior space partitioned from the interior storage space.

14. The method of claim 10 wherein the step of releasably securing the component chassis to the housing further comprises:
    extending a portion of a locking mechanism through a securing hole formed through a facing surface of the tab; and
    engaging a portion of the housing with the locking mechanism.

15. The method of claim 14 wherein the portion of the housing comprises an EIA rail attached to the housing.

16. A system for releasably securing a component chassis within a rack, comprising:
    a tab with a mounting hole extending therethrough;
    the mounting hole formed to receive a threaded screw;
    a facing surface attached to the tab along a vertical joint, the facing surface including a portion which extends vertically beyond a terminal end of the tab; and
    an offset notch in line with the vertical joint and located along a tab side edge of the extending portion of the facing surface.

17. The system of claim 16, further comprising a securing hole formed through the facing surface.

18. The system of claim 16 further comprising a handling lip attached to the facing surface opposite the vertical joint.

19. The system of claim 16 wherein the component chassis further comprises:
    a portion of a desk top computer;
    a mating slot formed in the component chassis; and
    the mating slot dimensioned to accept the tab.

20. The system of claim 19 further comprising:
    a interior storage space at least partially defined by the component chassis;
    the interior storage space containing electronic equipment associated with the desk top computer;
    a second interior space at least partially defined by the component chassis; and
    the second interior space partitioned from the interior storage space and accessible via the mating slot.

* * * * *